United States Patent [19]
Wen

[11] Patent Number: 5,831,312
[45] Date of Patent: Nov. 3, 1998

[54] ELECTROSTIC DISCHARGE PROTECTION DEVICE COMPRISING A PLURALITY OF TRENCHES

[75] Inventor: Jemmy Wen, Hsinchu, Taiwan

[73] Assignee: United Microelectronics Corporation, Taiwan

[21] Appl. No.: 630,024

[22] Filed: Apr. 9, 1996

[51] Int. Cl.$^6$ .............................. H01L 23/62
[52] U.S. Cl. .................. 257/360; 257/192; 257/594
[58] Field of Search ................... 257/288, 296, 257/301, 304, 360, 361, 622, 355, 356, 618, 594, 653, 192, 341

[56] References Cited

U.S. PATENT DOCUMENTS

| | | | |
|---|---|---|---|
| 3,041,213 | 6/1962 | Anderson et al. | 257/622 |
| 4,791,610 | 12/1988 | Takemae | 257/304 |
| 4,860,084 | 8/1989 | Shibata | 257/288 |
| 4,868,705 | 9/1989 | Shiochi et al. | 257/360 |
| 4,920,390 | 4/1990 | Fuse et al. | 257/301 |
| 4,984,055 | 1/1991 | Okumura et al. | 257/296 |
| 4,994,883 | 2/1991 | Chang et al. | 257/288 |
| 5,119,155 | 6/1992 | Hieda et al. | 257/304 |
| 5,214,303 | 5/1993 | Aoki | 257/622 |
| 5,336,902 | 8/1994 | Nigaki et al. | 257/622 |
| 5,336,921 | 8/1994 | Sundaram et al. | 257/622 |
| 5,352,913 | 10/1994 | Chung et al. | 257/306 |

*Primary Examiner*—Olik Chaudhuri
*Assistant Examiner*—Phat X. Cao
*Attorney, Agent, or Firm*—Fish & Richardson P.C.

[57] ABSTRACT

The present invention discloses two kinds of ESD protection devices, an MOS transistor and an diode, and their method of fabrication. The MOS transistor is fabricated in a semiconductor substrate having a plurality of trenches formed therein at one side of its gate. One of the source/drain regions of the MOS transistor is formed in the substrate and disposed along the periphery of those trenches. The diode is fabricated in a semiconductor substrate having a plurality of trenches formed therein. A dope region is thereafter formed in the substrate and disposed along the periphery of those trenches. Accordingly, either the MOS transistor or diode has a vertically enlarged area along the trenches to effectively prevent ESD damage, but without consuming a great amount of horizontal chip area.

4 Claims, 6 Drawing Sheets

ELECTROSTIC DISCHARGE PROTECTION DEVICE COMPRISING A PLURALITY OF TRENCHES

BACKGROUND OF THE INVENTION

1. Field of the Invention

The present invention relates in general to protection techniques used in integrated circuits. More particular, the present invention relates to a electrostatic discharge protection device and a method for fabricating the same.

2. Description of the Related Art

Electrostatic discharge, hereafter ESD, is a common phenomenon found to occur during handling of semiconductor IC devices. Electrostatic charges may accumulate for various reasons and cause damage to an IC device. Damage typically can occur during the testing phase of IC fabrication, during installation of the IC on a circuit board, as well as during the use of equipment into which the IC has been installed. Damage to a single IC due to poor ESD protection in an electronic device can hamper its designed functions partially, sometimes completely. Research into ESD protection for semiconductor IC's is, therefore, an important issue.

Those skilled in the IC art know that ESD is explained by four different models. The first such model is the human-body model (HBM). It is set forth in U.S. Military Standard MIL-STD-883, Method 3015.6. This Military Standard models the electrostatic stress produced on an IC device when a human carrying electrostatic charges touches the lead pins of the IC device. The second is a machine model (MM). This model is set forth in Industry Standard EIAJ-IC-121, which describes the electrostatic stress produced on an IC device when a machine carrying electrostatic charges contacts the lead pins of the IC device. The third model is the charged device model (CDM). This model describes the ESD current pulse generated when an IC device already carrying electrostatic charges is grounded in the process of its handling. The fourth model is the field induced model, which describes the electric potential induced in an IC device when it is placed in an electrostatic field. The electric potential may produce an ESD stress in the IC device when the device is later grounded during handling.

Referring to FIGS. 1 and 2, two ESD protection circuits widely-applied in integrated circuits is schematically depicted. In the drawings, an internal circuit 1 and an Input/Output pad 2 are connected together via a conducting line 3. In FIG. 1, two NMOS (metal-oxide-semiconductor) transistors M1 and M2 build up the ESD protection circuit. As shown in the drawing, the first transistor M1 has a pair of source/drain regions connected to a first voltage VDD and the Input/Output pad 2, respectively, and a gate connected to a second voltage VSS. The second transistor M2 is provided with a source and a gate tied together and connected to the second voltage Vss and the drain connected to the Input/Output pad 2. In FIG. 2, two diodes D1 and D2 are utilized to constitute the ESD protection circuit. As shown in the drawing, the first diode D1 has an anode and a cathode connected to the Input/Output pad 2 and the first voltage VDD, respectively. Moreover, the second diode D2 has an anode and a cathode connected to the second voltage VSS and the Input/Output pad 2, respectively. Usually, the first voltage VDD might be an independent voltage source of 5-Volt or 3-Volt, and the second voltage source VSS might be a grounded node.

Referring to FIG. 3, the MOS transistor M1 or M2, as depicted in FIG. 1, conventionally fabricated in a P-type semiconductor substrate 3 is shown in an elevated cross-section view. The conventional MOS transistor consists of: field oxides 30 formed on the semiconductor substrate 3 to define an active region 300 therebetween; a stacked gate 33 provided with a gate dielectric layer 31 and a gate electrode 32, from bottom to top, formed on the substrate 3 within the range of the active region 300; and a pair of N-type source/drain regions 34 and 35 formed in the substrate 3 at opposite sidewalls of the stacked gate 33, wherein source/drain region 35 has an area larger than the other source/drain region 34. Making use of the enlarged area, the source/drain region 35 can immediately discharge the ESD current to the substrate 3 so as to protect the internal circuit 1 from ESD damage during an ESD event.

Furthermore, referring to FIG. 4, the diode D1 or D2, as depicted in FIG. 2, conventionally fabricated in a P-type semiconductor substrate 4 is shown in elevated cross-section view. The conventional diode consists of: field oxides 40 formed on the substrate 4 to define an active region 400 therebetween; a N-type doped region 42 formed into the P-type substrate 4 with the range of the active region 400 to build up a PN junction along the periphery of the doped region 42 as the diode D1 or D2. The area of the doped region 42 should be large enough to rapidly discharge an ESD stress appearing at the Input/Output pad 2.

However, with the trend toward miniaturization, the area either the source/drain region 35 or doped region 42 can occupy is restricted. Therefore, there is a need for an ESD protection device capable of effectively withstanding ESD stress, but which does not occupy a great amount of area.

SUMMARY OF THE INVENTION

The present invention primarily concerns an ESD protection device capable of effectively discharging ESD current during an ESD event, but which does not require a large amount of area.

It is another object of the present invention to provide a method for fabricating the above-mentioned ESD protection device.

Accordingly, the present invention achieves the above-identified objects by providing an electrostatic discharge protection device, comprising: a semiconductor substrate of a first conductivity type; isolating structures formed on the substrate to define an active region therebetween; a stacked gate formed on the substrate within the active region, wherein a plurality of trenches are formed in the substrate at one side of the stacked gate; a pair of source/drain regions of a second conductivity type formed in the substrate at opposing sides of the stacked gate, wherein one of the source/drain regions is formed along the periphery of the trenches.

The present invention achieves the above-identified objects by providing a method for fabricating an electrostatic discharge protection device, comprising: providing a semiconductor substrate of a first conductivity type; forming isolating structures on the substrate to define an active region therebetween; forming a stacked gate on the substrate within the active region; forming a plurality of trenches in the substrate at one side of the stacked gate; and forming a pair of source/drain regions of a second conductivity type in the substrate at opposite sides of the stacked gate, wherein one of the source/drain regions is formed along the periphery of the trenches.

The present invention achieves the above-identified objects by providing an electrostatic discharge protection device, comprising: a semiconductor substrate of a first conductivity type; isolating structures formed on the substrate to define an active region therebetween, wherein a plurality of trenches are formed in the substrate within the active region; and forming a doped region of a second conductivity type in the substrate along the periphery of the trenches.

The present invention achieves the above-identified objects by providing a method for fabricating an electrostatic discharge protection device, comprising: providing a semiconductor substrate of a first conductivity type; forming isolating structures on the substrate to define an active region therebetween; forming a plurality of trenches in the substrate within the active region; and forming a doped region of a second conductivity type in the substrate along the periphery of the trenches.

BRIEF DESCRIPTION OF THE DRAWINGS

Other objects, features and advantages of the present invention will become apparent by way of the following detailed description of the preferred but non-limiting embodiment. The description is made with reference to the accompanying drawings, wherein.

DESCRIPTION OF THE PREFERRED EMBODIMENTS

Figure 1:
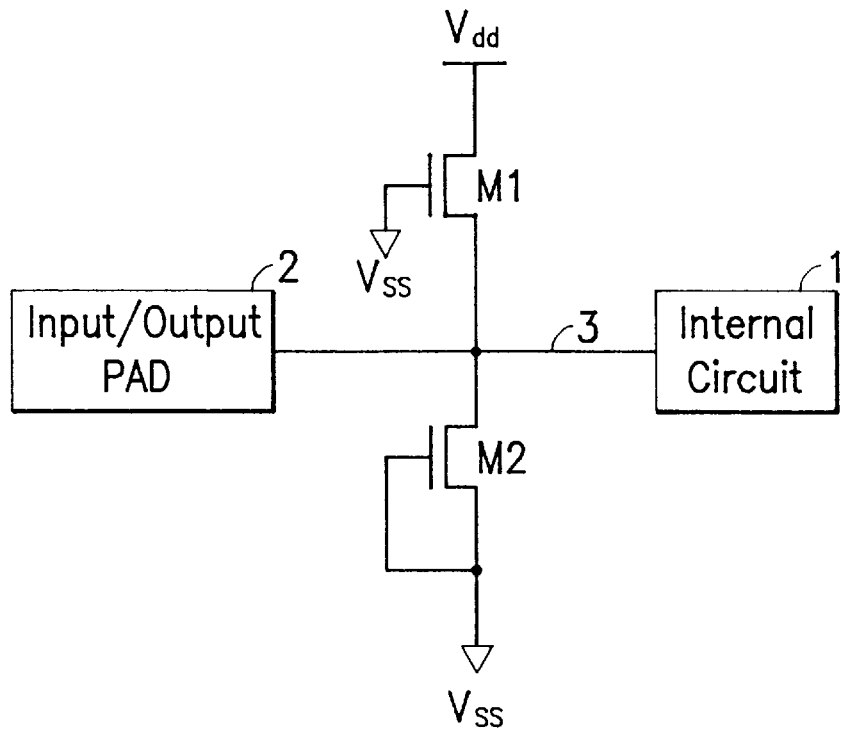
FIG. 1 schematically depicts an ESD protection circuit diagram constituted by two MOS transistors.
Figure 2:
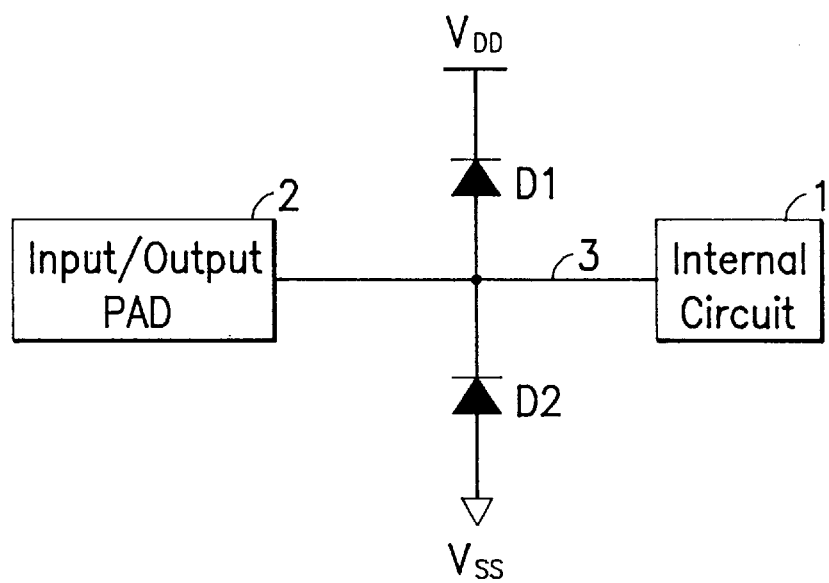
FIG. 2 schematically depicts another ESD protection circuit diagram constituted by two diodes.
Figure 3:
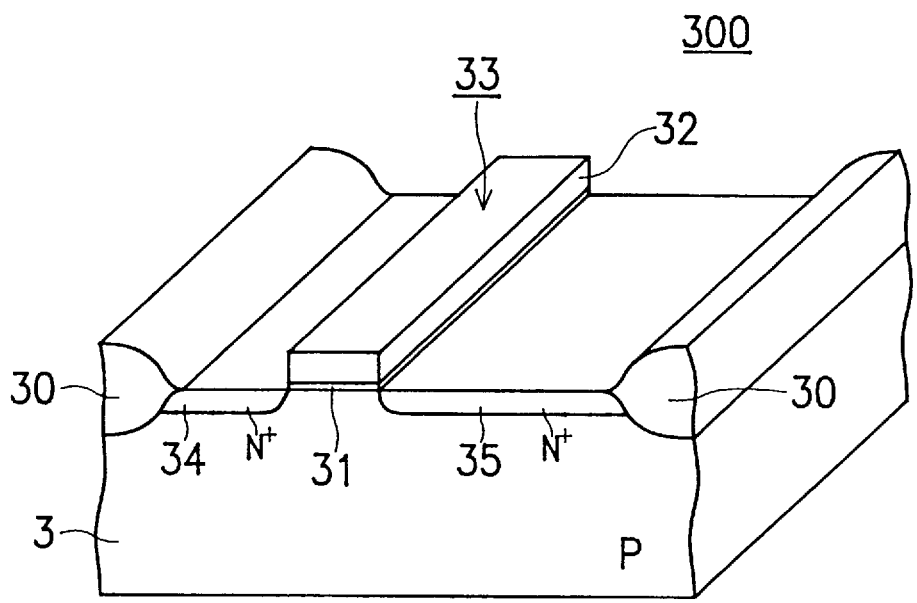
FIG. 3 depicts an elevated cross-section view of a conventional MOS transistor fabricated in a semiconductor substrate.
Figure 4:
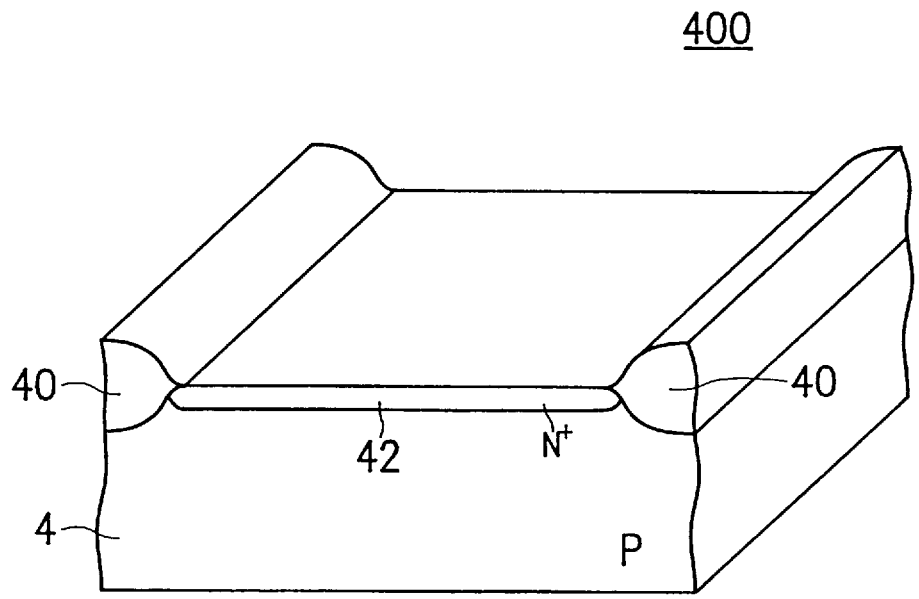
FIG. 4 depicts an elevated cross-section view of a conventional diode fabricated in a semiconductor substrate.
Figure 5A:
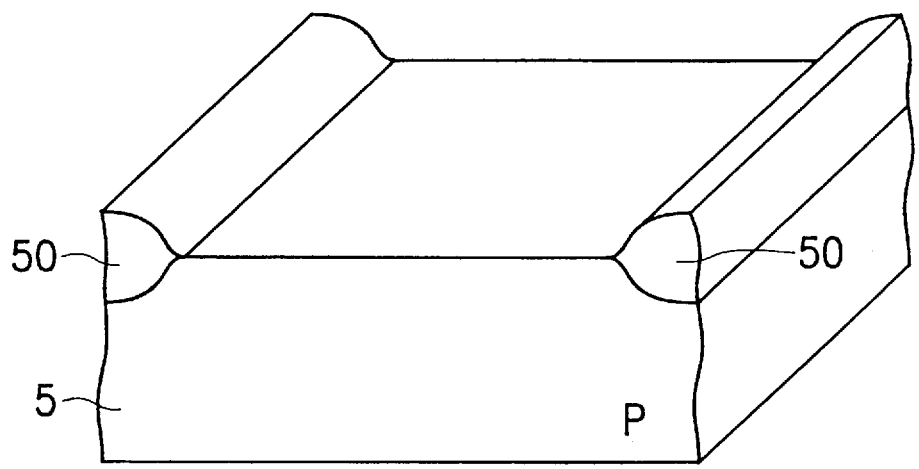
FIGS. 5A–5C depict in an elevated cross-section view of the process flow of one preferred embodiment according to the present invention.
Figure 5B:
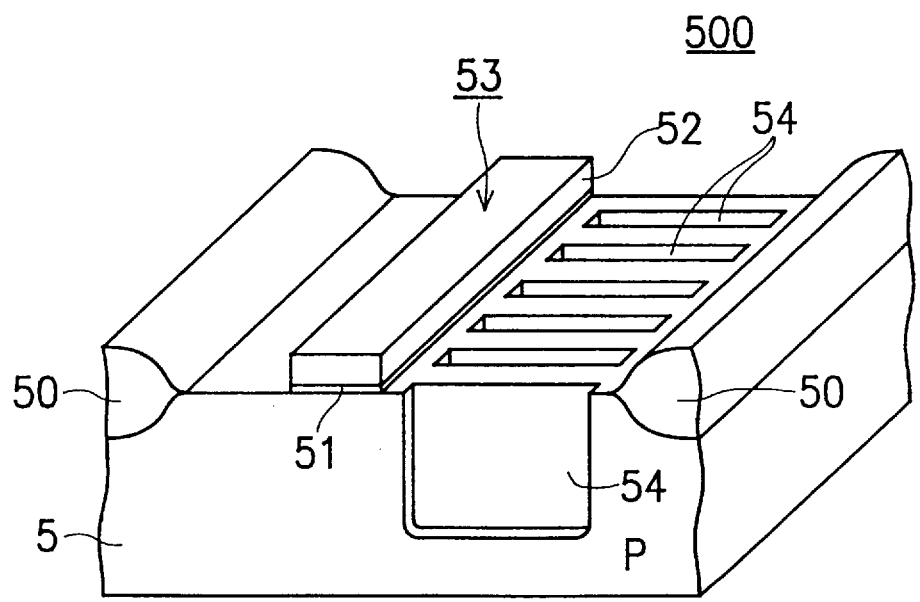
Figure 5C:
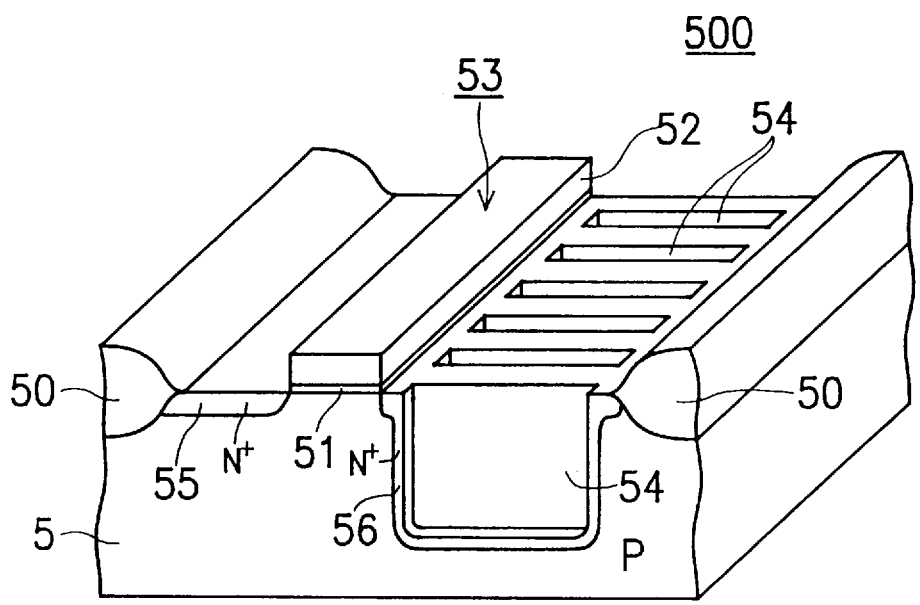

Referring to FIGS. 5A–5C, the process flow of one preferred embodiment is depicted in an elevated cross-section view. According to the present invention, an ESD protection device is fabricated in a semiconductor substrate 5, for instance, a P-type silicon wafer. In these drawings, a method for fabricating an ESD protection device of an NMOS transistor is shown.

First, as shown in FIG. 5A, isolating structures 50 are formed on the predetermined region of the substrate 5 to define an active region 500 therebetween. The isolating structures 50 might be field oxides formed by a local oxidation of silicon (LOCOS) process. Accordingly, the active region 500 is bounded by the field oxides.

Then, as shown in FIG. 5B, a silicon oxide layer is thermally grown on the substrate 5 not covered by the isolating structures 50 as a gate dielectric layer 51. A gate electrode layer 52 is thereafter formed to cover the gate dielectric layer 51. For example, the gate electrode layer 52 might be a polysilicon layer formed by chemical vapor deposition (CVD). After patterning by photolithography, the gate electrode layer 52 and the gate dielectric layer 51 are subsequently etched to form a stacked gate 53 as depicted in FIG. 5B. After that, the substrate 5, at one side of the stacked gate 53, is patterned and etched to form a plurality of trenches 54, preferably, by reactive ion etching. Each of those trenches 54 are shaped to have a depth of about 1–5 $\mu$m and a width of about 0.5–31 $\mu$m.

Next, as shown in FIG. 5C, an ion implantation process is performed by utilizing the stacked gate 53 and the isolating structures 50 as a mask. If the fabricated device is an NMOS transistor, the ions are N-type impurities, such as As+ or P+, which are implanted into the substrate 5 to form a pair of source/drain regions 55 and 56. Since the trenches 54 are formed at one side of the stacked gate 53, one of the source/drain regions, for example, the region 56 as depicted in FIG. SC, is disposed along the periphery of the trenches 54. Accordingly, the area of the source/drain region 56 is enlarged in the vertical dimension, without consuming additional horizontal chip area. When an ESD event occurs, the vertically enlarged area can rapidly discharge the ESD current appearing at the Input/Output pad 2 so as to prevent the internal circuit 1 from incurring ESD damage.

Furthermore, as depicted in FIG. SC, the source/drain region 56 should be disposed along the periphery of the trenches 54. Therefore, a two-step ion implantation procedure is implemented, which requires firstly tilting the device at an angle of about 15°–45° with respect to the plane of the substrate 5 for implanting ions to the sidewalls of the trenches 54, then secondly implanting ions without tilting the device (i.e., at nearly zero degrees). Then, sequential steps of depositing oxide or SOG (spin-on-glass) filling the trenches 54, forming contact windows therethrough, and forming contact metals connected to the source/drain regions 55 and 56, respectively, are thereafter processed.

Figure 6A:
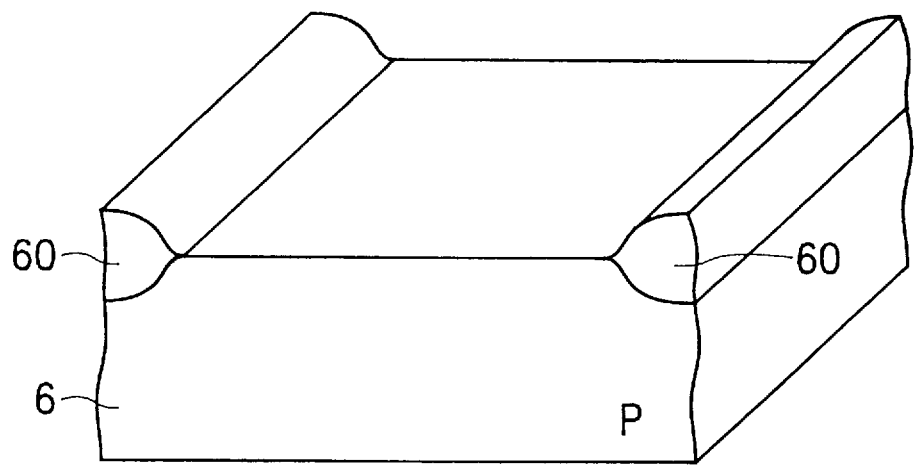
FIGS. 6A–6C depict in an elevated cross-section view of the process flow of another preferred embodiment according to the present.
Figure 6B:
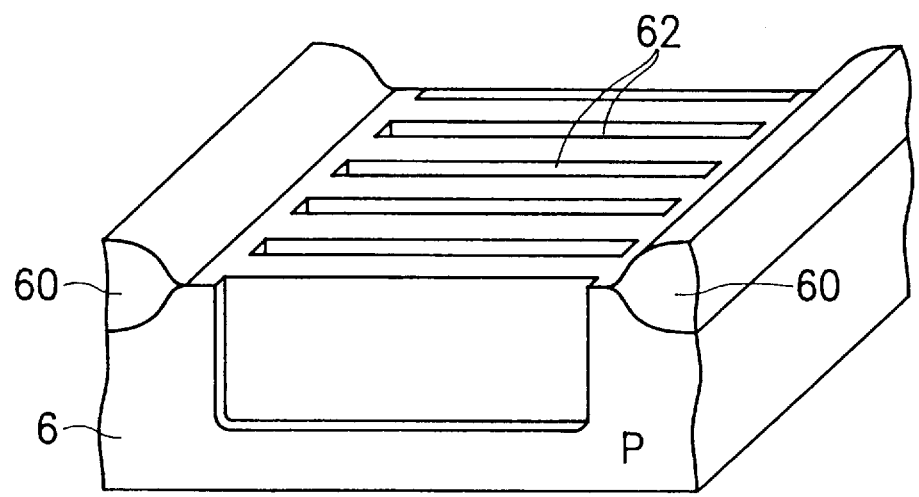
Figure 6C:
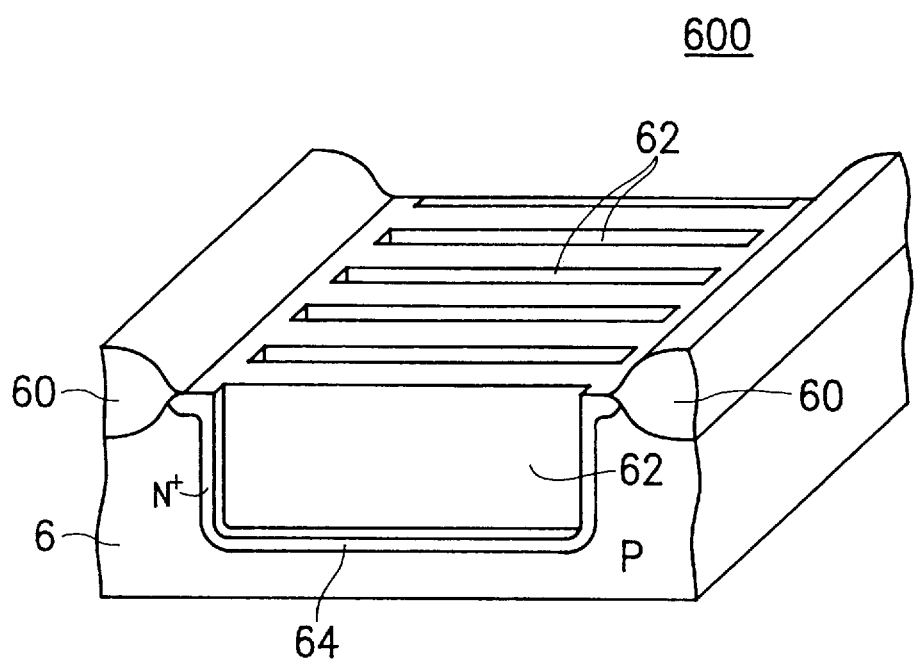

Referring to FIGS. 6A–6C, the process flow of another preferred embodiment is depicted in an elevated cross-section view. According to the present invention, an ESD protection device is fabricated in a semiconductor substrate 6, for instance, a P-type or an N-type silicon wafer. This embodiment utilizes a P-type substrate as exemplified. In these drawings, a method for fabricating an ESD protection device of a diode is depicted.

First, as shown in FIG. 6A, isolating structures 60 are formed on the predetermined region of the substrate 6 to define an active region 600 therebetween. The isolating structures 60 might be field oxides formed by a local oxidation of silicon (LOCOS) process. Accordingly, the active region 600 is automatically bounded by the field oxides.

Then, the substrate 6, within the range of the active region 600, is patterned and etched to form a plurality of trenches 62, preferably by reactive ion etching. Each of those trenches 62 are shaped to have a depth of about 1–5 $\mu$m and a width of about 0.5–3 $\mu$m. Next, as shown in FIG. 6C, an ion implantation process is performed by utilizing the isolating structures 60 as a mask. If the substrate 6 reveals P-type conductivity, the ions are N-type impurities, such as As+ or P+, which are implanted into the substrate 6 to form a doped region 64 along the periphery of the trenches 62. Therefore, a PN junction is formed between the doped region 64 and the substrate 6. Accordingly, the area of the PN junction is enlarged in the vertical dimension, but without consuming additional horizontal chip area. When an ESD event occurs, the vertically enlarged area can rapidly discharge the ESD current appearing at the Input/Output pad 2 so as to prevent the internal circuit 1 from incurring ESD damage.

Furthermore, as depicted in FIG. 6C, the doped region 64 should be disposed along the periphery of the trenches 62. Therefore, a two-step ion implantation procedure is implemented, which firstly tilting the device at an angle of about 15°–45° with respect to the plane of substrate 6 for implanting ions to the sidewalls of the trenches 62, then implanting ions at nearly zero degrees. Then, sequential steps consisting of depositing oxide or SOG (spin-on-glass) filling the trenches 62, forming contact windows therethrough, and forming contact metals connected to the doper region 64, are thereafter applied.

Alternatively, a N-type substrate and a P-type doped region can be used to constitute the diode by using the method depicted in FIGS. 6A–6C.

In conclusion, the present invention discloses two kinds of ESD protection devices, an MOS transistor and an diode, and their method of fabrication. The MOS transistor is fabricated in a semiconductor substrate having a plurality of trenches formed in the substrate at one side of its gate. One of the source/drain regions of the MOS transistor is formed in the substrate and disposed along the periphery of those trenches. The diode is fabricated in a semiconductor substrate having a plurality of trenches formed therein. A doped region is thereafter formed in the substrate and disposed along the periphery of those trenches. Accordingly, either the MOS transistor or diode has a enlarged area along the trenches in the vertical dimension to effectively prevent ESD damage, without consuming additional horizontal chip area.

What is claimed is:

1. An electrostatic discharge protection device, comprising:

a semiconductor substrate of a first conductivity type;

isolating structures formed on said substrate to define an active region therebetween;

a stacked gate formed on said substrate within said active region, wherein a plurality of trenches are formed in said substrate at one side of said stacked gate;

a pair of source/drain regions of a second conductivity type formed in said substrate at opposite sides of said stacked gate, wherein one of said source/drain region is formed along the periphery of said trenches.

2. The device as claimed in claim 1, wherein each of said trenches has a depth in a range between about 1–5 $\mu$m and a width in a range between about 0.5–3 $\mu$m.

3. The device as claimed in claim 1, wherein said stacked gate comprises a gate electrode layer overlying a gate dielectric layer.

4. The device as claimed in claim 1, wherein said isolating structures are field oxides.

* * * * *